(12) United States Patent
Yoshino et al.

(10) Patent No.: US 9,048,792 B2
(45) Date of Patent: Jun. 2, 2015

(54) POWER AMPLIFIER AND LIQUID JET PRINTING APPARATUS

(71) Applicant: SEIKO EPSON CORPORATION, Tokyo (JP)

(72) Inventors: Hiroyuki Yoshino, Matsumoto (JP); Atsushi Oshima, Shiojiri (JP); Noritaka Ide, Shiojiri (JP); Kunio Tabata, Shiojiri (JP); Nobuaki Azami, Matsumoto (JP); Shinichi Miyazaki, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 291 days.

(21) Appl. No.: 13/770,899

(22) Filed: Feb. 19, 2013

(65) Prior Publication Data
US 2013/0162351 A1 Jun. 27, 2013

Related U.S. Application Data

(63) Continuation of application No. 12/623,625, filed on Nov. 23, 2009, now Pat. No. 8,398,194.

(30) Foreign Application Priority Data

Nov. 27, 2008 (JP) .................. 2008-302744

(51) Int. Cl.
*B41J 29/38* (2006.01)
*H03F 3/217* (2006.01)

(52) U.S. Cl.
CPC .............. *H03F 3/217* (2013.01); *H03F 3/2171* (2013.01)

(58) Field of Classification Search
USPC ....................... 347/9–11, 19–20, 23
See application file for complete search history.

(56) References Cited

U.S. PATENT DOCUMENTS

| 7,244,007 | B2 * | 7/2007 | Ishizaki | ............................ 347/5 |
| 7,656,946 | B2 | 2/2010 | Morishima | |
| 2008/0018683 | A1 | 1/2008 | Oshima et al. | |
| 2008/0018687 | A1 * | 1/2008 | Tabata et al. | ................... 347/11 |
| 2008/0198191 | A1 * | 8/2008 | Oshima et al. | ................. 347/10 |

FOREIGN PATENT DOCUMENTS

| JP | 2005-210280 A | 8/2005 |
| JP | 2005-329710 A | 12/2005 |
| JP | 2006-211647 A | 8/2006 |

* cited by examiner

*Primary Examiner* — Jason Uhlenhake
(74) *Attorney, Agent, or Firm* — Maschoff Brennan

(57) ABSTRACT

A power amplifier includes: a modulator pulse-modulating a drive waveform signal serving as a reference of a drive signal applied to an actuator and outputting a plurality of modulated signals; a digital power amplifier having a plurality of digital power amplifier stages each including a pair of push-pull switching elements, amplifying the power of the plurality of modulated signals, and outputting multi-value amplified digital signals; and a low pass filter smoothing the amplified digital signals and outputting the drive signal, wherein the modulator includes a control section switching one of a state where the same modulated signal is connected to two or more of the digital power amplifier stages and a state where different modulated signals are connected to different digital power amplifier stages to the other.

4 Claims, 14 Drawing Sheets

POWER AMPLIFIER AND LIQUID JET PRINTING APPARATUS

This application is a Continuation of U.S. application Ser. No. 12/623,625, filed Nov. 23, 2009, which claims priority to Japanese Patent Application No. 2008-302744 filed on Nov. 27, 2008. The foregoing patent applications are incorporated herein by reference.

BACKGROUND

1. Technical Field

The present invention relates to a power amplifier that amplifies the power of a drive waveform signal serving as a reference for driving an actuator.

2. Related Art

In known liquid jet printing apparatuses, a liquid is ejected from nozzles by applying a drive signal, the power of which is amplified by a power amplifier, to actuators such as piezoelectric devices. However, when the power of the drive signal is amplified by the use of an analog power amplifier such as a push-pull transistor which is linearly driven, the power loss is great and a large heat sink for heat dissipation is necessary.

JP-A-2005-329710 discloses a technique for reducing the power loss and making a heat sink unnecessary by amplifying the power of a drive signal by the use of a digital power amplifier.

As described in JP-A-2005-329710, when the power of the drive signal is amplified by the use of the digital power amplifier, it is necessary to remove a frequency component of a modulated signal with a low pass filter before amplifying the power. To satisfactorily remove the frequency component of the modulated signals, a low pass filter having a steep frequency characteristic, that is, a high-order low pass filter, for stably transmitting a drive waveform signal component and satisfactorily removing the modulated signal frequency component is necessary. In this case, the potential difference between the terminals of the coil used in the low pass filter increases, leading to a higher hysteresis loss.

SUMMARY

An advantage of some aspects of the invention is that it provides a power amplifier which can lower the order of a low pass filter and provide a high-precision drive signal when the power of the drive signal is amplified by the use of a digital power amplifier.

According to an aspect of the present invention, a power amplifier including: a modulator that pulse-modulates a drive waveform signal serving as a reference of a drive signal applied to an actuator and outputs a plurality of modulated signals, a plurality of digital power amplifier stages each including a pair of push-pull switching elements to amplify the power of the plurality of modulated signals and output multi-value amplified digital signals, a low pass filter that filters the amplified digital signals to output the drive signal, and a control section in the modulator that switches between a state where one of the plurality of modulated signals is connected to two or more of the digital power amplifier stages and a state where the plurality of modulated signals are connected to different digital power amplifier stages.

According to this configuration, the modulated signals are amplified in the digital power amplifier stages and combined into an amplified digital signal, thus the amplified digital signal is in pulses or in steps.

The number of steps of arrival potentials of the amplified digital signal indicates the number of potentials at which the amplified digital signal in pulses or in steps arrives.

According to this configuration, since the outputs of the plural digital power amplifier stages are combined into the amplified digital signals, the potential difference between the steps of arrival potentials of the amplified digital signals decreases, thereby lowering the order of the low pass filter for removing a frequency component of the modulated signals from the amplified digital signals. It is also possible to acquire a high-precision drive signal by using multi-value signals as the amplified digital signals.

By lowering the order of the low pass filter, it is also possible to simplify the circuit configuration and to reduce the circuit size.

Since the potential difference between the steps of the arrival potentials of the amplified digital signals is small, it is possible to lower the withstanding voltage of the switching elements of the digital power amplifier, thereby reducing the circuit size.

Since the source potential can be lowered with the same current consumption, it is possible to reduce the circuit size and save the power.

Particularly, when a front digital power amplifier stage is turned on and a rear digital power amplifier stage is turned off, it is possible to regenerate the power and to further save the power.

By switching between the state where the same modulated signal is connected to two or more of the digital power amplifier stages and the state where the modulated signals are connected to the distinct digital power amplifier stages, it is possible to enhance the precision of the drive signal.

In the power amplifier, the control section may connect the same modulated signal to two or more of the digital power amplifier stages in a period when an input-output response characteristic of a pulse modulation is nonlinear.

According to this configuration, it is possible to enhance the precision of the drive signal to avoid the nonlinear part of the input-output response characteristic of the pulse modulation.

In the power amplifier, the modulator may set a pulse modulation frequency in a predetermined period to be higher than the pulse modulation frequency in a period other than the predetermined period.

According to this configuration, it is possible to satisfactorily reduce the modulation frequency component of the pulse modulation by the use of the low pass filter.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
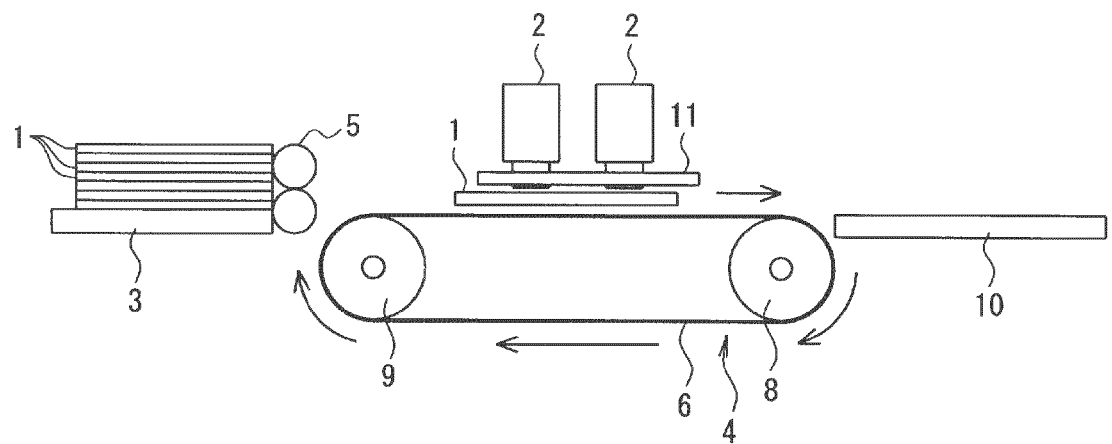
FIG. 1 is a front view schematically illustrating the configuration of a liquid jet printing apparatus employing a power amplifier according to an embodiment of the invention.

A power amplifier used in a liquid jet printing apparatus according to an embodiment of the invention will now be described. FIG. 1 is a diagram schematically illustrating the configuration of the liquid jet printing apparatus according to an embodiment of the invention. FIG. 1 shows a line-head printing apparatus in which a print medium 1 is conveyed in a direction of a left to right arrow and is subjected to a printing operation in a print area in the course of conveyance thereof.

In FIG. 1, reference numeral 2 represents plural liquid jet heads disposed above a conveyance line of the print medium 1. The liquid jet heads are arranged to form two lines in a print medium conveying direction and to extend in a direction intersecting the print medium conveying direction and are fixed to a head fixing plate 11.

Plural nozzles are formed on the bottom surface of each liquid jet head 2 and this surface is called a nozzle plane.

Figure 2:
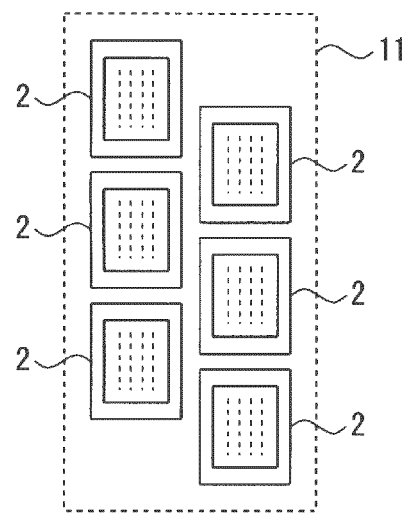
FIG. 2 is a plan view illustrating the vicinity of a liquid jet head used in the liquid jet printing apparatus shown in FIG. 1.

As shown in FIG. 2, the nozzles are arranged in a line shape in the direction intersecting the print medium conveying direction for each color of the liquid to be ejected, where the line is called a nozzle line and the line direction is called a nozzle line direction.

A line head covering the entire width in the direction intersecting the conveying direction of the print medium 1 is formed by the nozzle lines of all the liquid jet heads 2 arranged in the direction intersecting the print medium conveying direction.

When the print medium 1 passes below the nozzle planes of the liquid jet heads 2, a liquid is ejected from plural nozzles formed in the nozzle plane to perform a printing operation.

The liquid jet heads 2 are supplied with four-color liquids of yellow (Y), magenta (M), cyan (C), and black (K) via liquid supply tubes from liquid tanks (not shown).

By simultaneously ejecting a predetermined amount of liquid from the nozzles formed in each liquid jet head 2 to a predetermined position, minute dots are formed on the print medium 1.

By performing this operation for each color and once passing the print medium 1 conveyed by a conveying section 4, a one-pass printing operation can be carried out.

An electrostatic method, a piezoelectric method, or a film boiling liquid jet method can be employed as a method of ejecting a liquid from the nozzles of each liquid jet head 2. The piezoelectric method is employed in this embodiment.

In the piezoelectric method, when a drive signal is applied to a piezoelectric device as an actuator, a vibration plate in a cavity is deformed to cause a variation in pressure in the cavity and a liquid is ejected from the nozzle due to the variation in pressure.

It is possible to adjust the amount of the ejected liquid by adjusting a wave height of a drive signal or a voltage varying slope.

The invention may be similarly applied to other liquid jet method other than the piezoelectric method.

A conveying section 4 for conveying the print medium 1 in the conveying direction is disposed below the liquid jet heads 2.

In the conveying section 4, a conveying belt 6 is suspended on a driving roller 8 and a driven roller 9 and an electric motor (not shown) is connected to the driving roller 8.

An adsorption unit (not shown) for adsorbing the print medium 1 onto the surface of the conveying belt 6 is disposed inside the conveying belt 6.

An air suction unit adsorbing the print medium 1 onto the conveying belt 6 using a negative pressure or an electrostatic adsorption unit adsorbing the print medium 1 onto the conveying belt 6 with an electrostatic force is used as the adsorption unit.

Accordingly, when a sheet of the print medium 1 is fed to the conveying belt 6 from a pickup section 3 by the use of a pickup roller 5 and the driving roller 8 is rotationally driven by an electric motor, the conveying belt 6 rotates in the print medium conveying direction, and the print medium 1 is adsorbed onto the conveying belt 6 by the adsorption unit and is conveyed.

A printing operation is performed by ejecting a liquid from the liquid jet heads 2 in the course of conveying the print medium 1.

The print medium 1 having been subjected to the printing operation is discharged downstream to a sheet discharge section 10 in the conveying direction.

A print reference signal output device including a linear encoder is disposed in the conveying belt 6.

The print reference signal output device monitors that the conveying belt 6 and the print medium 1 adsorbed to and conveyed by the conveying belt move in synchronization, outputs a pulse signal corresponding to the necessary print resolution with the movement of the conveying belt 6 after the print medium 1 passes through a predetermined position in a conveying path, and outputs a drive signal to the actuator 22 from a drive circuit to be described later on the basis of the pulse signal, whereby a predetermined color of liquid is ejected to a predetermined position on the print medium 1 and a predetermined image is drawn on the print medium 1 by the use of dots.

A control device controlling the liquid jet printing apparatus is disposed in the liquid jet printing apparatus according to this embodiment.

Figure 3:
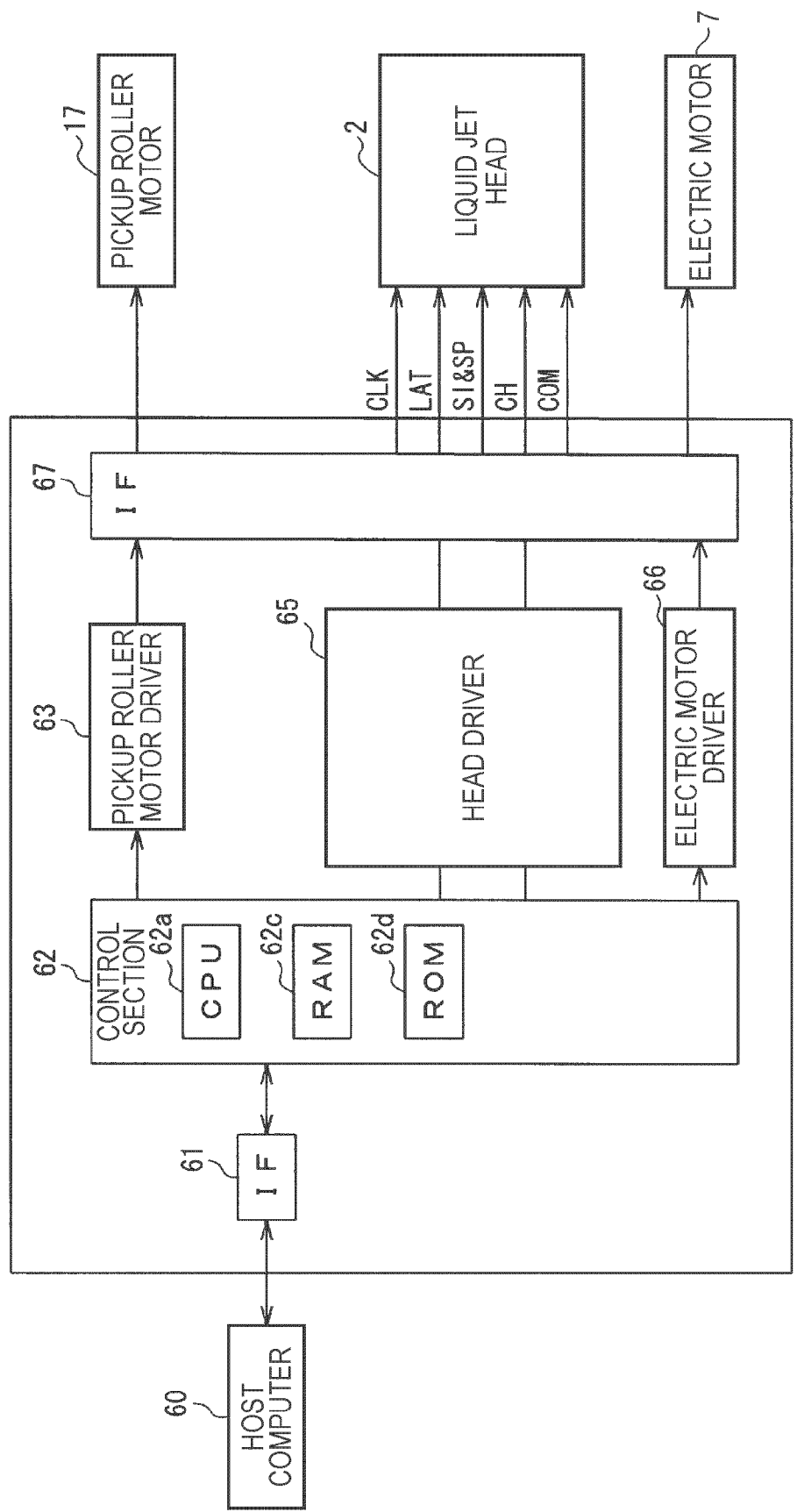
FIG. 3 is a block diagram illustrating a controller of the liquid jet printing apparatus shown in FIG. 1.

As shown in FIG. 3, the control device includes an input interface 61 reading print data input from a host computer 60, a control section 62 including a micro computer and performing a computing operation such as a printing process on the basis of the print data input from the input interface 61, a pickup roller motor driver 63 controlling the driving of a pickup roller motor 17 connected to a pickup roller 5, a head driver 65 controlling the driving of the liquid jet heads 2, an electric motor driver 66 controlling the driving of an electric motor 7 connected to the driving roller 8, and an interface 67 connecting the pickup roller motor driver 63, the head driver 65, and the electric motor driver 66 to the pickup roller motor 17, the liquid jet heads 2, and the electric motor 7.

The control section 62 includes a CPU (Central Processing Unit) 62a performing various processes such as a printing process, a RAM (Random Access Memory) 62c temporarily storing print data input via the input interface 61 and various data used to perform the printing process of the print data and the like or temporarily developing programs for the printing process and the like, and a ROM (Read-Only Memory) 62d formed of a nonvolatile semiconductor memory storing control programs executed by the CPU 62a.

When the control section 62 receives the print data (image data) from the host computer 60 via the input interface 61, the CPU 62a performs a predetermined process on the print data, calculates nozzle selection data (drive pulse selection data) such as data on what nozzle should jet a liquid or what amount of liquid should be ejected, and outputs a drive signal and a control signal to the pickup roller motor driver 63, the head driver 65, and the electric motor driver 66 on the basis of the print data, the drive pulse selection data, and input data from various sensors.

The pickup roller motor 17, the electric motor 7, and the actuators 22 in the liquid jet heads 2 operate by the drive signal and the control signal, and processes of picking up, conveying, and discharging the print medium 1 and the printing process of the print medium 1 are performed.

The elements of the control section 62 are electrically connected to each other via a bus (not shown).

Figure 4:
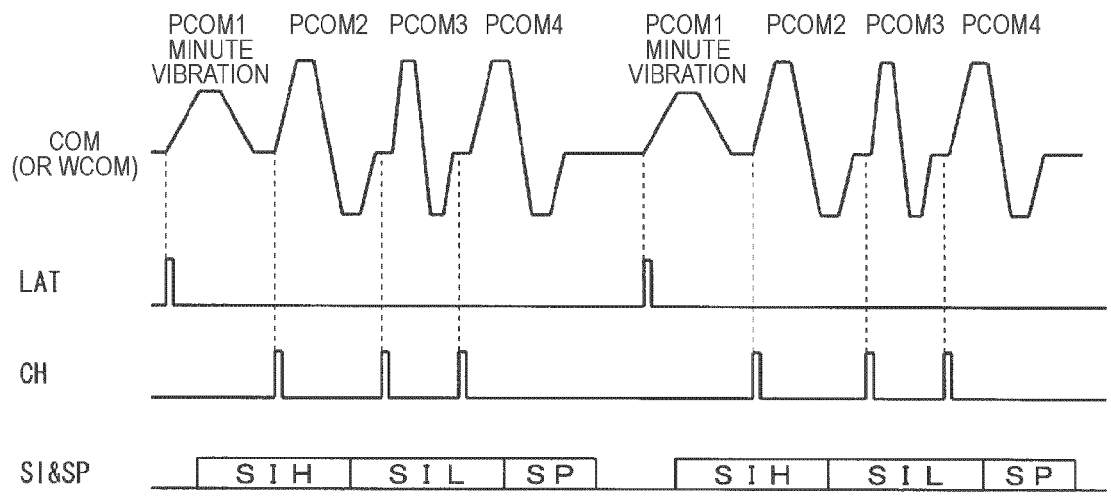
FIG. 4 is a diagram illustrating a drive signal used to drive actuators of liquid jet heads.

FIG. 4 shows an example of a drive signal COM which is supplied to the liquid jet heads 2 from the controller of the liquid jet printing apparatus according to this embodiment and used to drive the actuators 22 formed of piezoelectric devices.

In this embodiment, a signal of which the potential varies about a middle potential is used.

The drive signal COM is obtained by connecting drive pulses PCOM as unit drive signals for driving the actuators 22 to jet the liquid in time series. The rising edge of each drive pulse PCOM is a step where the volume of a cavity (pressure chamber) communicating with the nozzle is enlarged to draw in the liquid (it may be considered that a meniscus is drawn in, in consideration of the liquid ejecting plane), and the falling edge of the drive pulse PCOM is a step where the volume of the cavity is reduced to press out the liquid (it may be considered that a meniscus is pressed out in consideration of the liquid ejecting plane). By pressing out the liquid, the liquid is ejected from the nozzle.

By variously changing the voltage variation slope or the wave height of the drive pulse PCOM having such a voltage-based waveform, the amount of liquid drawn-in or the drawing-in speed and the amount of liquid pressed-out or the pressing-out speed can be changed. Accordingly, the amount of jet liquid can be changed to obtain dots having different sizes.

Therefore, when plural drive pulses PCOM are connected in time series, it is possible to obtain dots having various sizes by selecting a single drive pulse PCOM therefrom and supplying the selected drive pulse to the actuator 22 to jet the liquid, or by selecting plural drive pulses PCOM and supplying the selected drive pulses to the actuator 22 to jet the liquid plural times.

That is, when plural liquid droplets land at the same position with as the liquid that has not dried, it is substantially the same as ejecting large liquid droplets, thereby enlarging the dots.

By combination of these techniques, it is possible to accomplish an increase in gray scale.

The drive pulse PCOM1 at the left end of FIG. 4 serves to only draw in the liquid but not to press out the liquid.

This is called minute vibration and is used to suppress or prevent the thickening of the nozzles without ejecting the liquid.

As the control signals from the controller shown in FIG. 3 in addition to the drive signal COM, the liquid jet head 2 is supplied with drive pulse selection data SI&SP for selecting the nozzles to eject the liquid on the basis of the print data and determining a connection time of the drive signal COM to the actuators 22 of the piezoelectric devices, a latch signal LAT and a channel signal CH for connecting the drive signal COM to the actuators 22 of the liquid jet heads 2 on the basis of the drive pulse selection data SI&SP after nozzle selection data are input into all the nozzles, and a clock signal CLK for transmitting the drive pulse selection data SI&SP as a serial signal to the liquid jet heads 2.

In the following description, the minimum unit of drive signals for driving the actuators 22 is referred to as drive pulse PCOM and the entire signal obtained by connecting the drive pulses PCOM in time series is referred to as drive signal COM.

That is, a series of drive signals COM is output as the latch signal LAT and the drive pulse PCOM is output as each channel signal CH.

Figure 5:
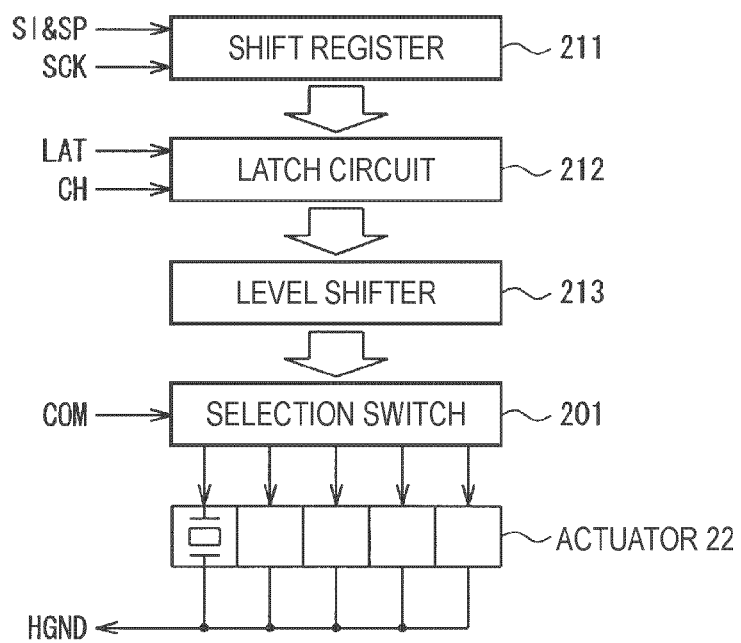
FIG. 5 is a block diagram illustrating the configuration of a switching controller.

FIG. 5 shows the specific configuration of a switching controller constructed in the liquid jet heads 2 so as to supply the drive signal COM (drive pulses PCOM) to the actuators 22.

The switching controller includes a shift register 211 storing the drive pulse selection data SI&SP for specifying the actuators 22 such as the piezoelectric devices corresponding to the nozzles to jet the liquid, a latch circuit 212 temporarily storing data of the shift register 211, and a level shifter 213 connecting the drive signal COM to the actuators 22 such as the piezoelectric devices by converting the level of the output of the latch circuit 212 and supplying the converted output to the selection switch 201.

The shift register 211 is sequentially supplied with the drive pulse selection data SI&SP and a memory area is shifted from the initial stage to the subsequent stage on the basis of the input pulse of the clock signal CLK.

The latch circuit 212 latches the output signals of the shift register 211 on the basis of the input latch signal LAT after the drive pulse selection data SI&SP corresponding to the number of nozzles is stored in the shift register 211.

The signals stored in the latch circuit 212 are converted into a voltage level which can turn on or off the selection switch 201 at the subsequent stage by the level shifter 213.

This is because the drive signal COM has a voltage higher than the output voltage of the latch circuit 212 and thus the dynamic voltage range of the selection switch 201 is set high.

Therefore, the actuators 22 such as the piezoelectric devices of which the selection switch 201 is turned off by the level shifter 213 are connected to the drive signals COM (drive pulses PCOM) at the connection time of the drive pulse selection data SI&SP.

After the drive pulse selection data SI&SP of the shift register 211 is stored in the latch circuit 212, next print information is input to the shift register 211 and the data stored in the latch circuit 212 is sequentially updated to correspond to the liquid ejecting time.

In the drawing, reference sign HGND represents a ground terminal of the actuators 22 such as the piezoelectric devices.

Even after the actuators 22 such as the piezoelectric devices are disconnected from the drive signal COM (drive pulses PCOM), the input voltage of the corresponding actuators 22 is maintained in the voltage just before the disconnection by the selection switch 201.

Figure 6:
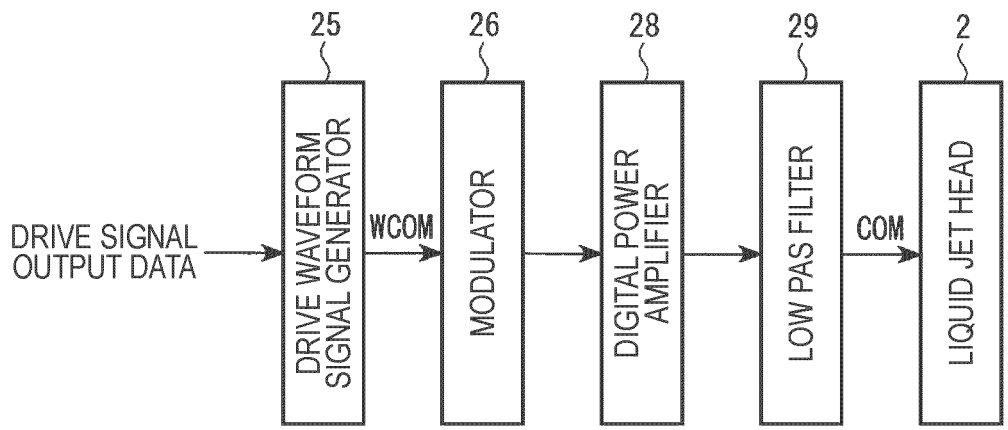
FIG. 6 is a block diagram illustrating an example of a drive circuit for an actuator.

FIG. 6 shows the schematic configuration of the drive circuit of the actuators 22.

Figure 7:
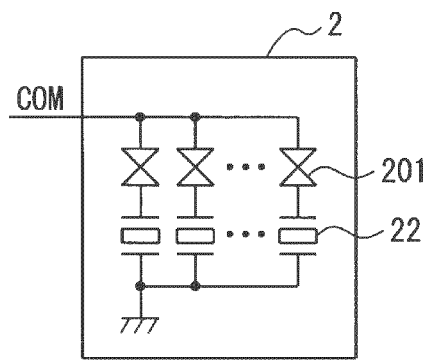
FIG. 7 is a block diagram illustrating a liquid jet head shown in FIG. 6.

Plural nozzles are formed in the liquid jet heads 2 of the line-head printing apparatus, the above-mentioned actuator 22 is disposed in each nozzle as shown in FIG. 7, the selection switch 201 formed of a transmission gate is disposed on the upstream side of the actuator 22, and the drive signal COM (drive pulses PCOM) are applied to only the actuator 22 of which the selection switch 201 is turned on.

The drive circuit includes a drive waveform generator 25 generating the source of the drive signal COM (drive pulses PCOM), that is, a drive waveform signal WCOM as a reference of a signal controlling the driving of the actuator 22, on the basis of previously stored waveform data, a modulator 26 pulse-modulating the drive waveform signal WCOM generated by the drive waveform generator 25, a digital power amplifier 28 amplifying the power of the modulated signal pulse-modulated by the modulator 26, and a low pass filter 29 smoothing the amplified digital signal of which the power has been amplified by the digital power amplifier 28 and supplying the smoothed amplified digital signal as the drive signal COM (drive pulses PCOM) to the actuators 22 of the liquid jet heads 2.

The drive waveform generator 25 combines and outputs the predetermined digital potential data in time series, converts the combined digital potential data into analog data by the use of a D/A converter, and outputs the converted data as the drive waveform signal WCOM.

In this embodiment, a pulse width modulator (PWM) is used as the modulator 26 pulse-modulating the drive waveform signal WCOM.

As known in the past, the pulse width modulator generates a reference signal such as a triangular wave signal or a saw-toothed signal of a predetermined frequency, compares the drive waveform signal WCOM with the reference signal, and outputs as the modulated signal a pulse signal which is on-duty when the drive waveform signal WCOM is higher than the reference signal.

Figure 8:
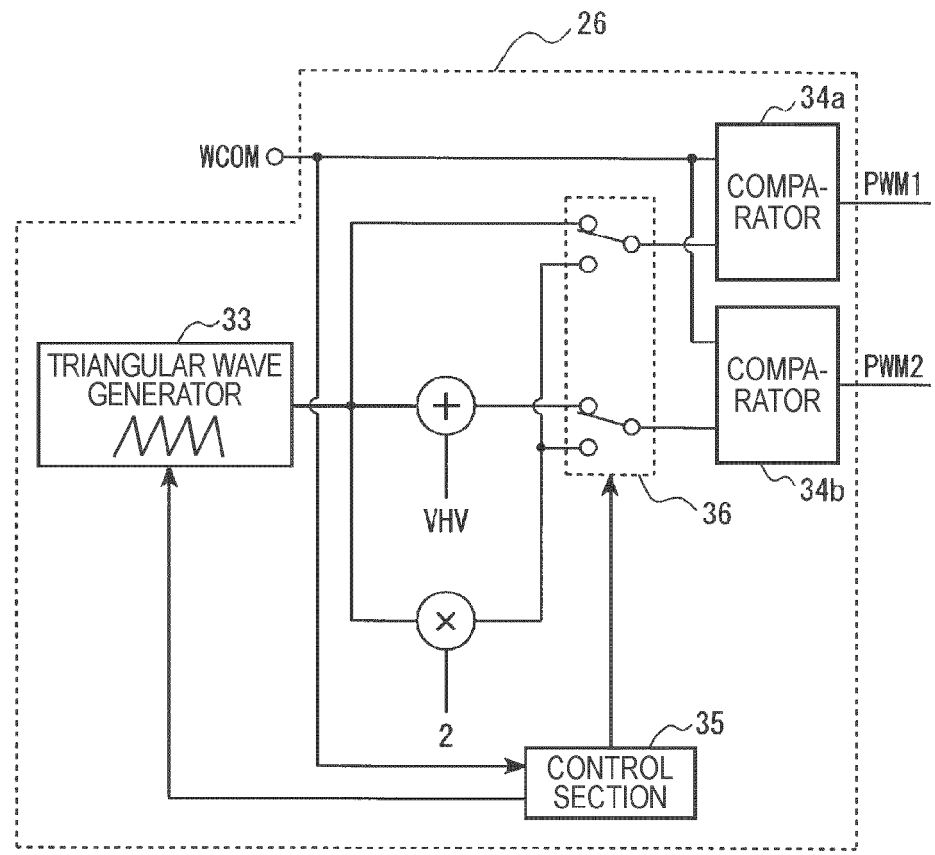
FIG. 8 is a block diagram illustrating a modulator shown in FIG. 6.

However, normally in this embodiment, as shown in FIG. 8, a triangular wave signal which is generated from a triangular wave generator 33 and of which the wave height is equal to about a source potential VHV is input to the first comparator 34a, the comparison result with the drive waveform signal WCOM is output as a first modulated signal PWM1, a signal obtained by adding the source potential VHV to the triangular wave signal is input to a second comparator 34b, and the comparison result with the drive waveform signal WCOM is output as a second modulated signal PWM2.

When the selection switch 36 is switched by the control section 35, the double value of the triangular wave signal generated from the triangular wave signal generator 33 is input to the first and second comparators 34a and 34b, and the comparison results with the drive signal waveform signal WCOM is output as the first and second modulated signals PWM1 and PWM2.

That is, when the selection switch 36 is switched by the control section 35, the first modulated signal PWM1 and the second modulated signal PWM2 have the same value and thus the power amplifier to be described later is synchronized.

The triangular wave signal generator 33 can change the frequency of the triangular wave signal and the control section 35 changes the frequency of the triangular wave signal to a frequency higher than the normal case at the time of switching the selection switch 36.

The details thereof will be described later.

In this embodiment, since two digital power amplifier stages are disposed in the digital power amplifier 28, the modulator 26 outputs the modulated signals corresponding to plural digital power amplifier stages.

Figure 9:
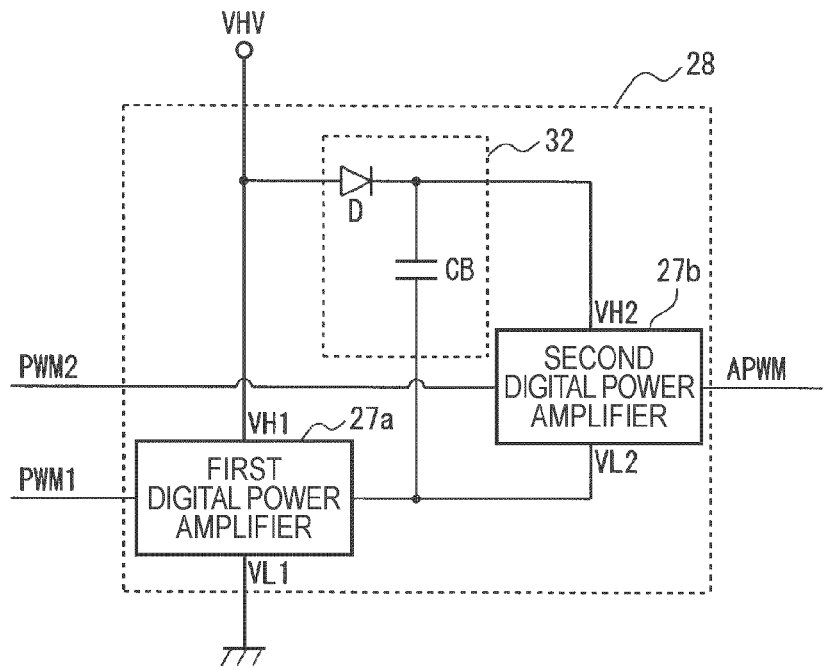
FIG. 9 is a block diagram illustrating a digital power amplifier shown in FIG. 6.

As shown in FIG. 9, the digital power amplifier 28 includes a first digital power amplifier 27a amplifying the power of the first modulated signal PWM1 and a second digital power amplifier 27b amplifying the power of the second modulated signal PWM2.

The high side of the first digital power amplifier 27a is connected to the power source VHV and the low side is grounded.

A bootstrap circuit 32 is interposed between the first digital power amplifier 27a and the second digital power amplifier 27b. The high side of the second digital power amplifier 27b is connected to the power source VHV via a commutator D of the bootstrap circuit 32 and the low side thereof is connected to the output terminal of the first digital power amplifier 27a.

That is, the low side of the second digital power amplifier 27b corresponding to the rear stage is biased by the output of the first digital power amplifier 27a corresponding to the front stage.

The bootstrap circuit 32 includes a commutator D regulating the current from the high side of the second digital power amplifier 27b and a capacitor CB charged with the potential difference between the power source VHV and the output of the first digital power amplifier 27a.

The capacity of the capacitor CB is set to be enough to drive the actuator 22 which is a capacitive load formed of a piezoelectric device.

Specifically, the capacity is set to a capacity capable of guaranteeing a bootstrap potential when the first digital power amplifier 27a of the front stage is turned on and the second digital power amplifier 27b of the rear stage is turned off.

Figure 10:
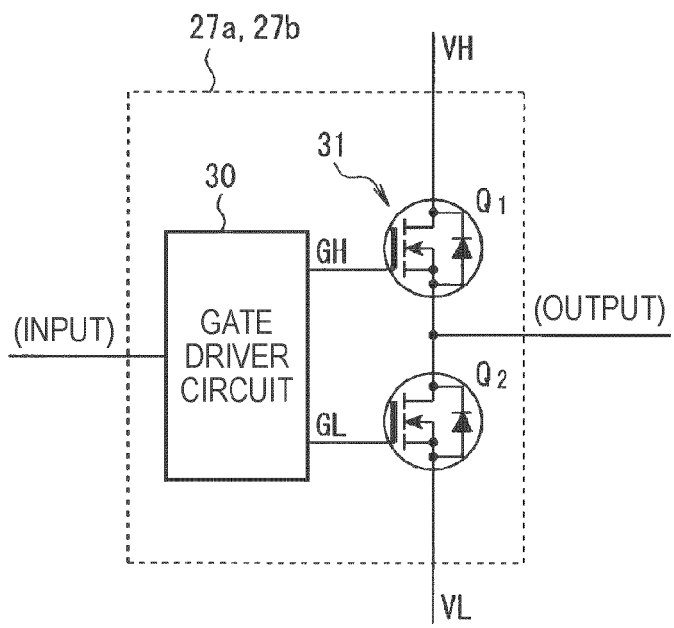
FIG. 10 is a block diagram illustrating the digital power amplifier shown in FIG. 9.

As shown in FIG. 10, the first and second digital power amplifiers 27a and 27b each include a half bridge output terminal 31 including a high-side switching element Q1 and a low-side switching element Q2 for substantially amplifying the power and a gate driver circuit 30 for adjusting gate-source signals GH and GL of the high-side switching element Q1 and the low-side switching element Q2 on the basis of the modulated signals from the modulator 26.

The gate-source signals GH and GL of the high-side switching element Q1 and the low-side switching element Q2 are inverted signals.

In the digital power amplifiers 27a and 27b, when the modulated signal is at a high level, the gate-source signal GH of the high-side switching element Q1 is at the high level and the gate-source signal GL of the low-side switching element Q2 is at a low level. Accordingly, the high-side switching element Q1 is switched to the ON state and the low-side switching element Q2 is switched to the OFF state. As a result, the output of the half bridge output terminal 31 has a high-side potential.

On the other hand, when the modulated signal is at a low level, the gate-source signal GH of the high-side switching element Q1 is at the low level and the gate-source signal GL of the low-side switching element Q2 is at the high level. Accordingly, the high-side switching element Q1 is switched to the OFF state and the low-side switching element Q2 is switched to the ON state. As a result, the output of the half bridge output terminal 31 has a low-side potential.

In this way, when the high-side and low-side switching elements are driven in a digital manner, current flows in the switching element in the ON state, but the resistance value between the drain and the source is very small and thus the power loss is hardly caused.

Since no current flows in the switching element in the OFF state, the power loss is not caused.

Therefore, the power loss of the digital power amplifiers 27a and 27b is very small and thus a switching element such as a small-sized MOSFET can be employed, thereby making a cooling mechanism such as a cooling heat sink unnecessary.

In addition, the efficiency is about 30% when a transistor is linearly driven, but the efficiency of the digital power amplifier is 90% or more.

The cooling heat sink of the transistor needs to have a size of 60 mm square for each transistor. Accordingly, when the cooling heat sink is made unnecessary, it is very advantageous in view of an actual layout.

Figure 11:
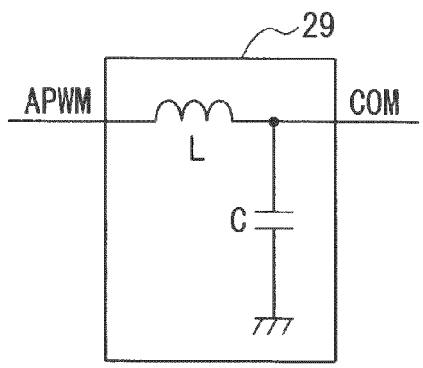
FIG. 11 is a block diagram illustrating a low pass filter shown in FIG. 6.

As shown in FIG. 11, the low pass filter 29 includes a combination of a coil L and a capacitor C and removes the modulation frequency component of the amplified digital signal APWM, that is, the frequency component of the triangular wave signal.

In this embodiment, the first digital power amplifier 27a is disposed as the rear stage of the second digital power amplifier 27b of the front stage of which the high side is connected to the power source VHV and the low side of the first digital power amplifier 27a is bootstrapped up to the potential of the power source VHV by the bootstrap circuit 32. Accordingly, when the first digital power amplifier 27a is turned off, the output of the second digital power amplifier 27b is output as the amplified digital signal APWM from the first digital power amplifier 27a. However, when the first digital power amplifier 27a is turned on, the added value of the output of the first digital power amplifier 27a and the output of the second digital power amplifier 27b is output as the amplified digital signal APWM from the first digital power amplifier 27a.

The operation of the control section 35 of the modulator 26 will now be described.

Figure 12:
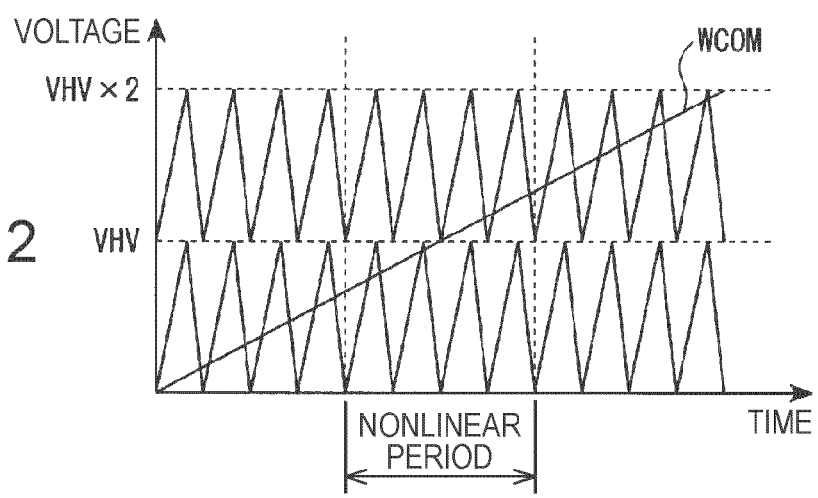
FIG. 12 is a diagram illustrating an example of a triangular wave signal.

As described above, at the normal time when the selection switch 36 is not switched by the control section 35, the triangular wave signal which is generated from the triangular wave signal generator 33 and of which the wave height is equal to about the source potential VHV is input to the first comparator 34a as shown in FIG. 12 and a signal obtained by adding the source potential VHV to the triangular wave signal is input to the second comparator 34b.

Figure 13:
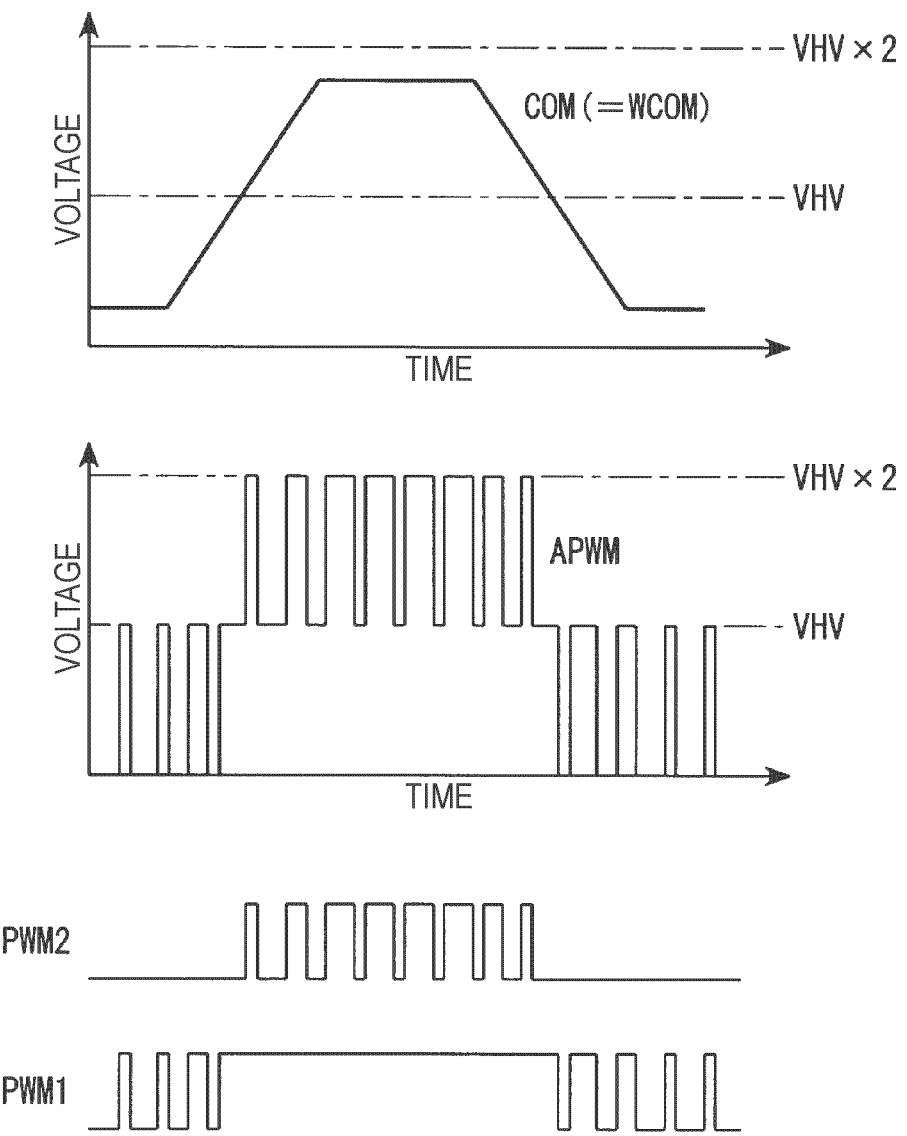
FIG. 13 is a diagram illustrating a drive signal based on the triangular wave signal shown in FIG. 12.

Since the voltages of the two triangular wave signals do not overlap with each other, the first modulated signal PWM1 of the first and second modulated signals PWM1 and PWM2 as the comparison result of the triangular wave signals and the drive waveform signal WCOM holds the high level in the area where the drive waveform signal WCOM (the drive signal COM in the drawing) is equal to or higher than the source potential VHV as shown in FIG. 13.

The amplified digital signal APWM has a value obtained by adding the first modulated signal PWM1 and the second modulated signal PWM2, the amplified digital signal APWM of the first modulated signal PWM1 amplified by the first digital power amplifier 27a has a pulse between the source potential VHV and the 0 potential, the amplified digital signal APWM of the second modulated signal PWM2 amplified by the second digital power amplifier 27b and added thereto has a pulse between the source potential VHV and the double value thereof VHV×2.

Therefore, since the amplified digital signal APWM having the added value of two amplified digital signals has the 0 potential, the source potential VHV, and the double value of the source potential VHV×2 as arrival potentials, the number of steps of arrival potentials is "3" and is greater than the number of stages "2" of the digital power amplifiers 27a and 27b.

As the number of steps of arrival potentials of the amplified digital signal APWM before being smoothed by the low pass filter 29 increases, the waveform precision of the drive signal COM (drive pulses PCOM) after being smoothed, improves.

The source potential VHV is a half the wave height of the drive signal COM, that is, the amplified digital signal APWM, which is excellent. Accordingly, it is possible to satisfactorily remove the modulation frequency even when the frequency characteristic of the low pass filter 29 is relatively slow.

In other words, since the order of the low pass filter 29 can be lowered, the size can be reduced, and the potential difference between terminals of the coil L can be reduced, the loss due to the hysteresis can be reduced.

Since the total current flowing in the two-stage digital power amplifiers 27a and 27b is constant but the source potential VHV is about a half of the wave height of the drive signal COM, that is, the amplified digital signal APWM, which is excellent, it is possible to save the power and to lower the withstanding voltage of the switching elements Q1 and Q2 of the digital power amplifiers 27a and 27b, thereby reducing the circuit size.

When the first digital power amplifier 27a of the front stage is turned on and the second digital power amplifier 27b of the rear stage is turned off by the bootstrap circuit 32, the power regeneration that the electric charges of the actuators 22 as the capacitive load and the capacitor CB of the bootstrap circuit 32 flow to the power source VHV is caused, thereby further saving the power.

Figure 14A:
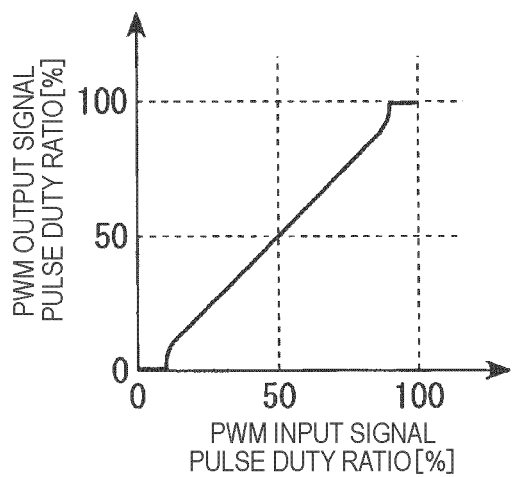
FIGS. 14A and 14B are diagrams illustrating an input-output response of pulse width modulation.
Figure 14B:
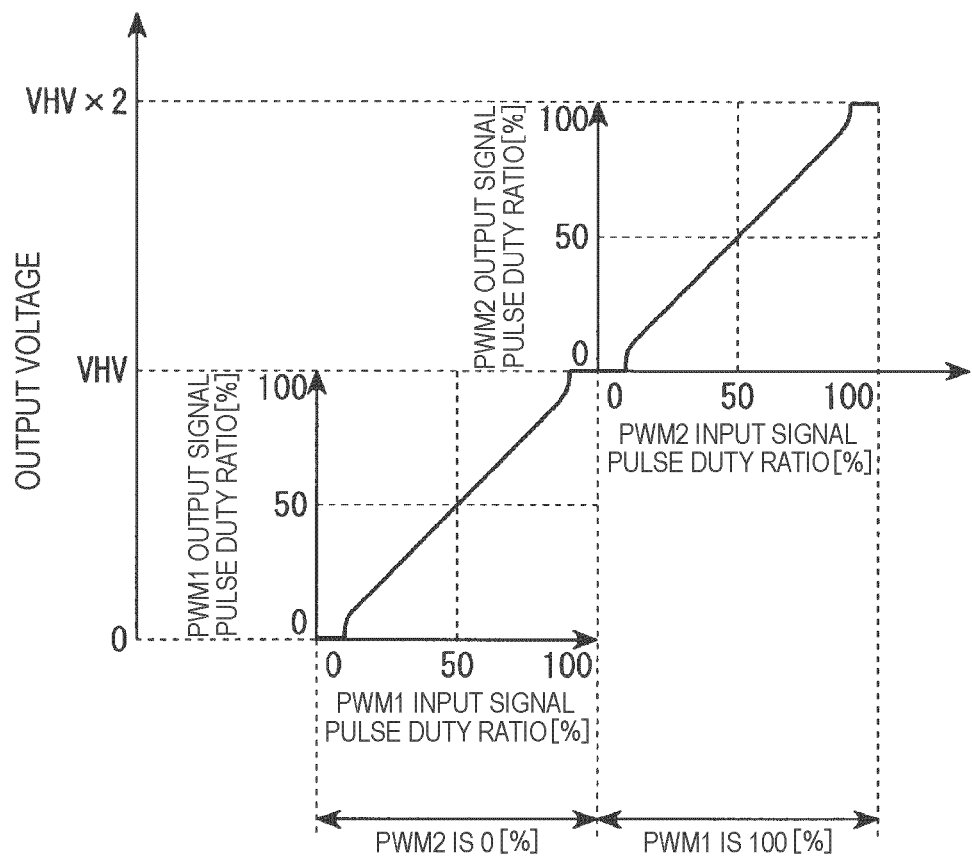

However, since the on-duty or off-duty pulse width of the input-output response characteristic of pulse width modulation is small and thus the response is not sufficient, a nonlinear area exists in the vicinity of 0% or 100% of the pulse duty ratio (duty ratio in the drawing) as shown in FIG. 14A. As shown in FIG. 12, when each of the first modulated signal PWM1 and the second modulated signal PWM2 uses 0% to 100% of the pulse duty ratio without overlapping two triangular wave sinals, the nonlinear area appears in the switching parts of the first modulated signal PWM1 and the second modulated signal PWM2 as shown in FIG. 14B. (Similarly, the vicinities of the output voltage 0 V and VHV×2V which are nonlinear may not be used by setting the duty ratio.)

The switching parts of the first modulated signal PWM1 and the second modulated signal PWM2 are also the switching parts of the first digital power amplifier 27a of the front stage and the second digital power amplifier 27b of the rear stage and are also the switching time of the arrival potentials of amplified digital signal APWM, that is, the source potential VHV, and the vicinity thereof.

Figure 15:
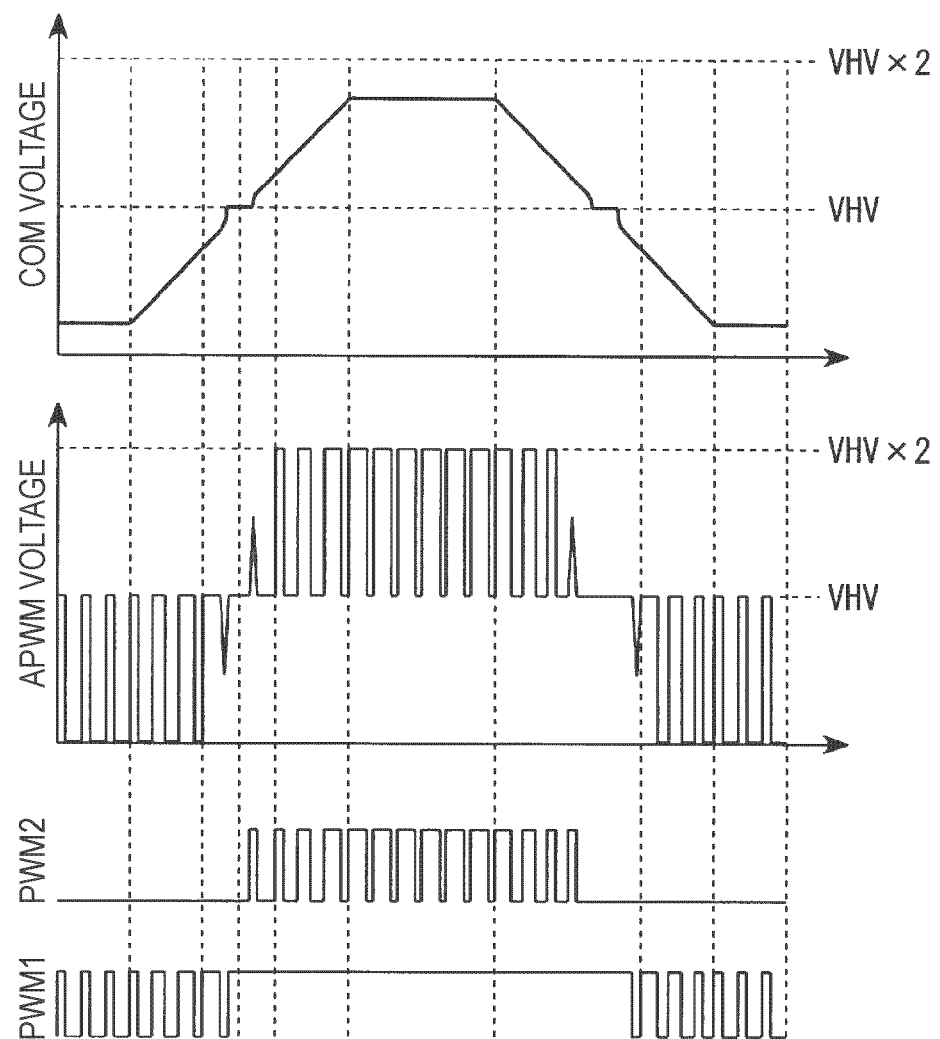
FIG. 15 is a diagram illustrating a drive signal based on a triangular wave signal shown in FIGS. 14A and 14B.

As a result, as shown in FIG. 15, a distortion occurs in the amplified digital signal APWM, whereby the drive signal COM (drive pulses PCOM) is also distorted.

Figure 16:
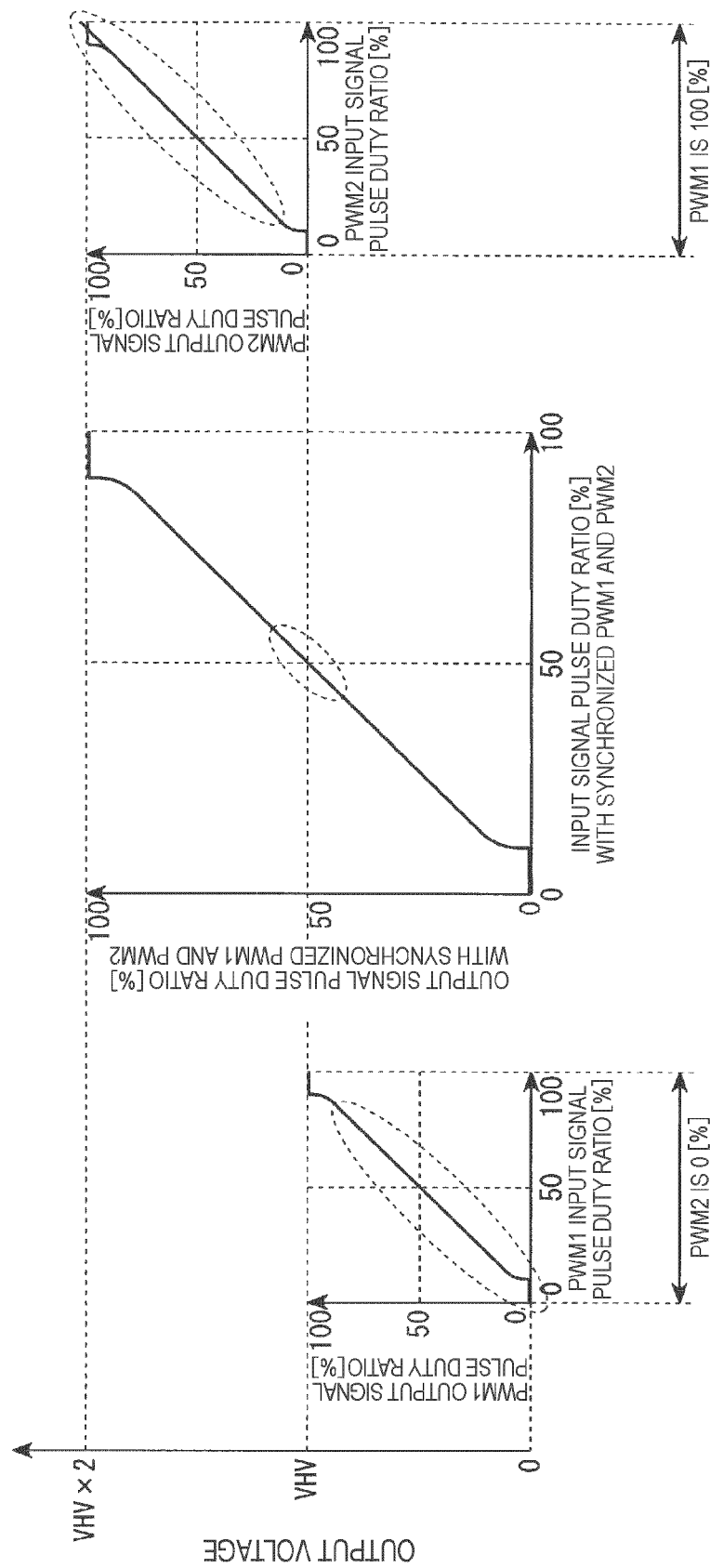
FIG. 16 is a diagram illustrating an input-output response of pulse width modulation carried out by the modulator shown in FIG. 18.

Therefore, in this embodiment, as shown in FIG. 16, in the switching time of the arrival potentials of the amplified digital signal APWM of which the input-output response characteristic of pulse width modulation is nonlinear and a predetermined period including the switching time, the first digital power amplifier 27*a* and the second digital power amplifier 27*b* are synchronized for the switching and the same amplified digital signal APWMSYNC is output from the two digital power amplifiers 27*a* and 27*b*.

Specifically, as shown in FIG. 16, in the switching time of the first modulated signals PWM1 and the second modulated signal PWM2 and a predetermined period including the switching time, that is, when the drive waveform signal WCOM is in a predetermined area, the selection switch 36 is switched by the control section 35 and the triangular wave signal of which the wave height is double is input to both of the first comparator 34*a* and the second comparator 34*b*.

When the triangular wave signal of which the wave height is double is input to both of the first comparator 34*a* and the second comparator 34*b*, the first modulated signal PWM1 and the second modulated signal PWM2 output from the two comparators 34*a* and 34*b* have the same value, that is, become the synchronized modulated signal PWMSYNC. That is, the synchronized voltage-amplified modulated signal APWMSYNC is output from the two digital power amplifiers 27*a* and 27*b* synchronized with each other.

That is, the control section 35 makes a control to switch one of the states where the same modulated signal APWMSYNC is connected to two digital power amplifiers 27*a* and 27*b* and the state where different modulated signals PWM1 and PWM2 are connected to different digital power amplifiers 27*a* and 27*b*, respectively, to the other.

In this way, by synchronizing the first digital power amplifier 27*a* of the front stage and the second digital power amplifier 27*b* of the rear stage with each other for the switching and outputting the same amplified digital signal APWMSYNC from the two digital power amplifiers 27*a* and 27*b* in the switching time of the arrival potentials of the amplified digital signal APWM of which the input-output response characteristic of pulse width modulation is nonlinear and a predetermined period including the switching time, it is possible to avoid the nonlinear area of the input-output response characteristic of the first modulated signal PWM1 and the second modulated signal PWM2 and thus to enhance the waveform precision of the drive signal COM (drive pulses PCOM).

Figure 17:
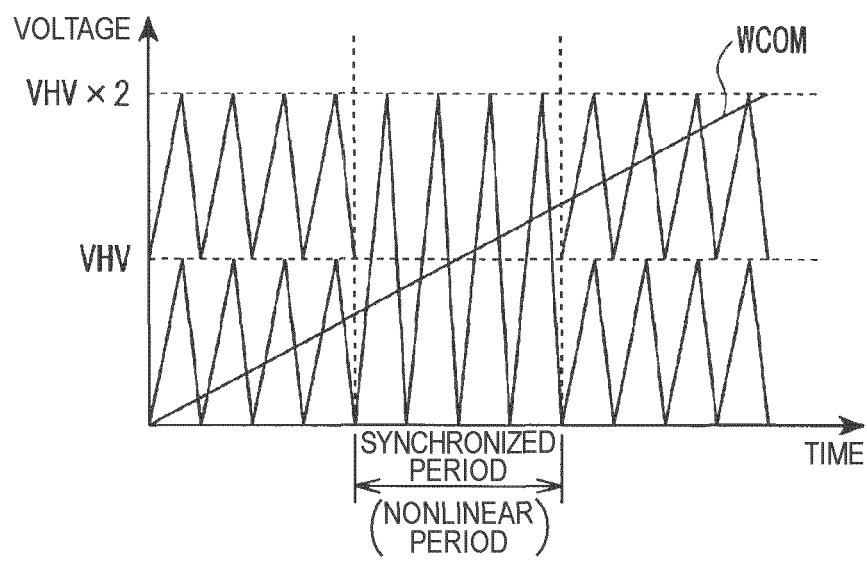
FIG. 17 is a diagram illustrating a triangular wave signal enabling the pulse width modulation shown in FIG. 16.
Figure 18:
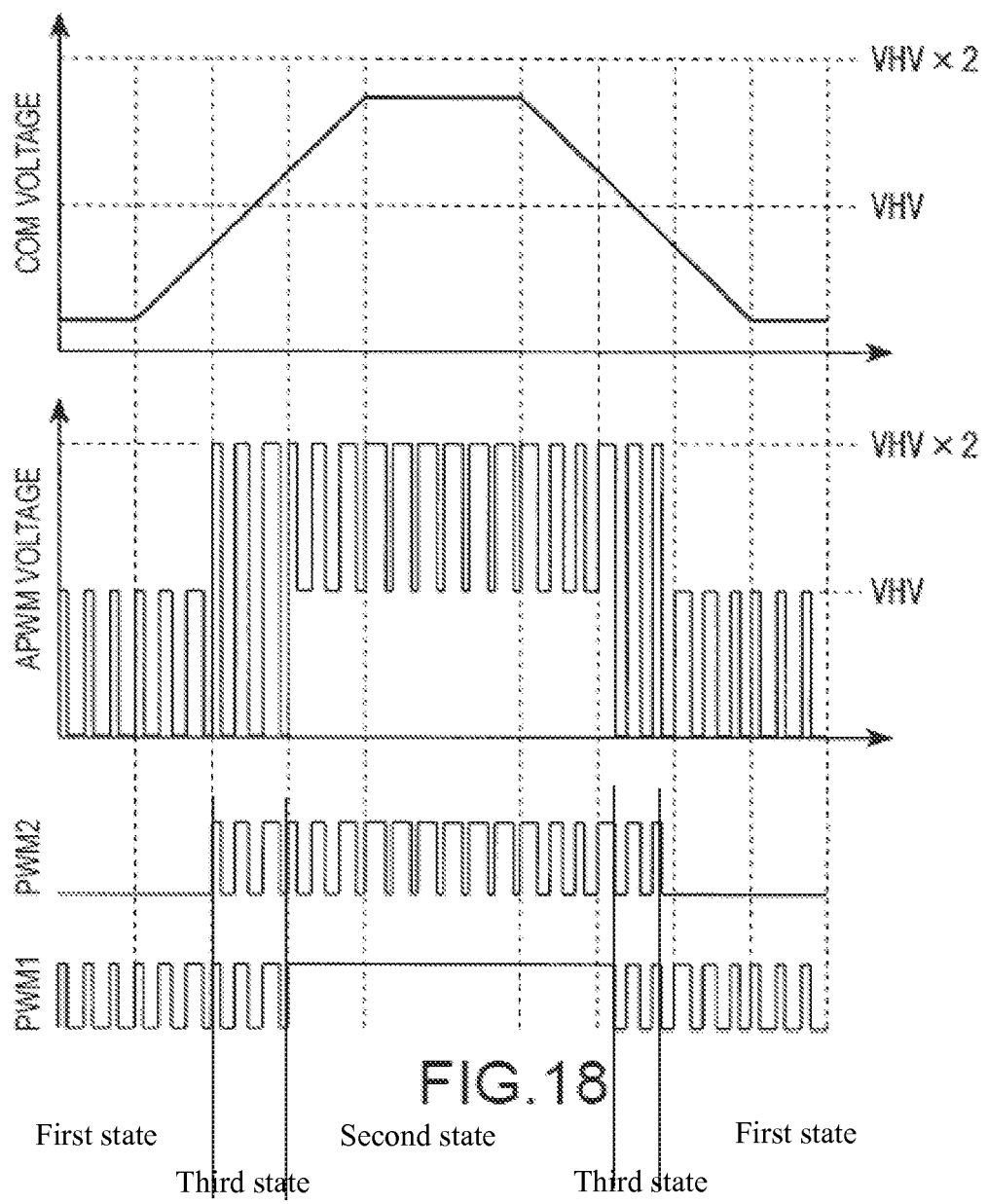
FIG. 18 is a diagram illustrating a drive signal based on the triangular wave signal shown in FIG. 17.

FIG. 18 shows the amplified digital signal APWM and the drive signal COM (drive pulse PCOM) of which the distortion can be removed by the use of the triangular wave signal shown in FIG. 17.

However, a case can be considered where the distortion can be removed by the use of the triangular wave signal shown in FIG. 17 but the satisfactory waveform precision of the drive signal COM (drive pulses PCOM) cannot be obtained.

Figure 19:
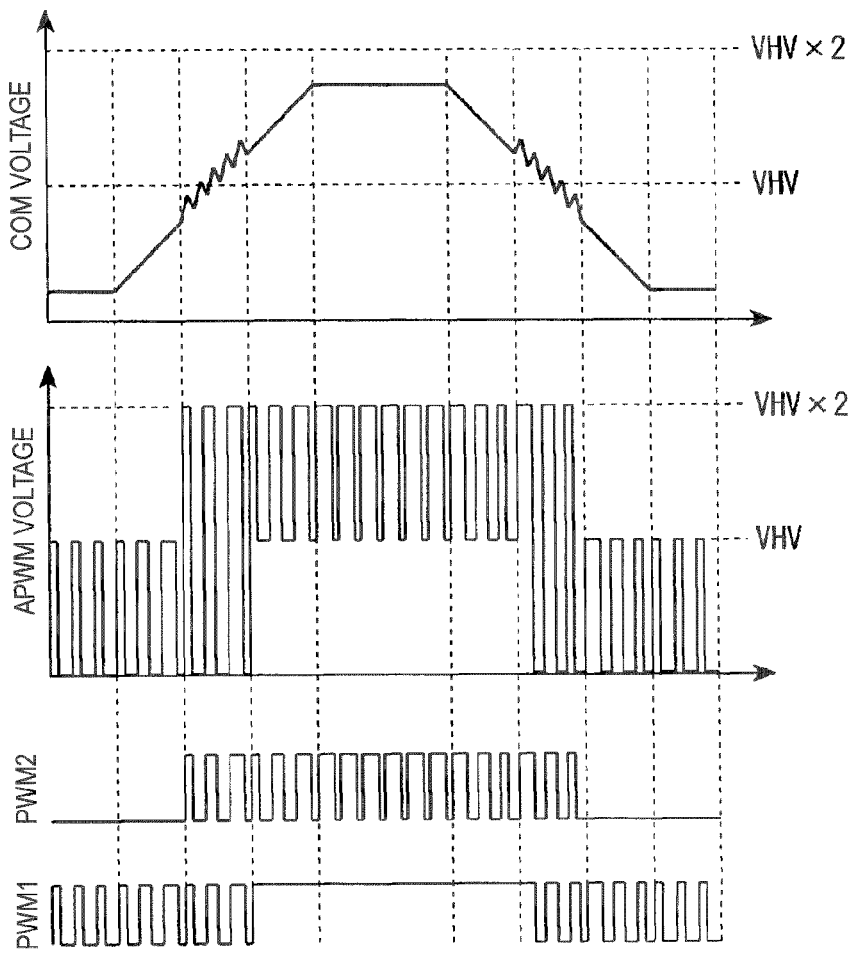
FIG. 19 is a diagram illustrating a drive signal based on the triangular wave signal shown in FIG. 17.

An example thereof is shown in FIG. 19.

This is an example where the frequency component of the triangular wave signal, that is, the modulation frequency component, remains in the drive signal COM (drive pulses PCOM) because the first modulated signal PWM1 and the second modulated signal PWM2 are the same synchronized modulated signal PWMSYNC and the voltage amplitude is doubled. In this case, the modulation frequency component cannot be satisfactorily reduced by the low pass filter 29.

To satisfactorily reduce the remaining modulation frequency component by the use of the low pass filter 29, the frequency characteristic of the low-pass filter should be steep, that is, the gain of the modulation frequency domain should be made very small. Accordingly, as described above, the order of the low-pass filter should be raised and the original problem is caused again.

Figure 20:
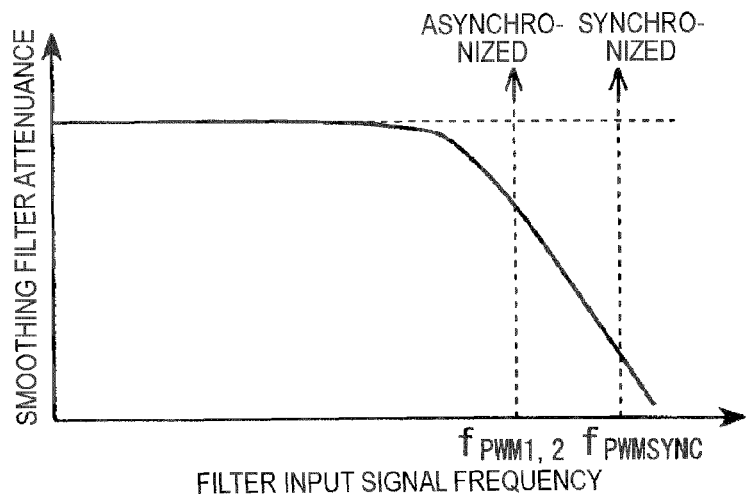
FIG. 20 is a diagram illustrating a frequency response characteristic of the low pass filter shown in FIG. 11.

Therefore, in this embodiment, as shown in FIG. 20, the frequencies should be enhanced at the time of synchronizing the first modulated signal PWM1 and the second modulated signal PWM2, so as to satisfactorily reduce the modulation frequency component fPWMSYNC with low-order low-pass filters having the same frequency characteristic.

Specifically, the control section 35 controlling the switching of the selection switch 36 controls the operating frequency of the triangular wave signal generator 33 to raise the frequency of the triangular wave signal.

Figure 21:
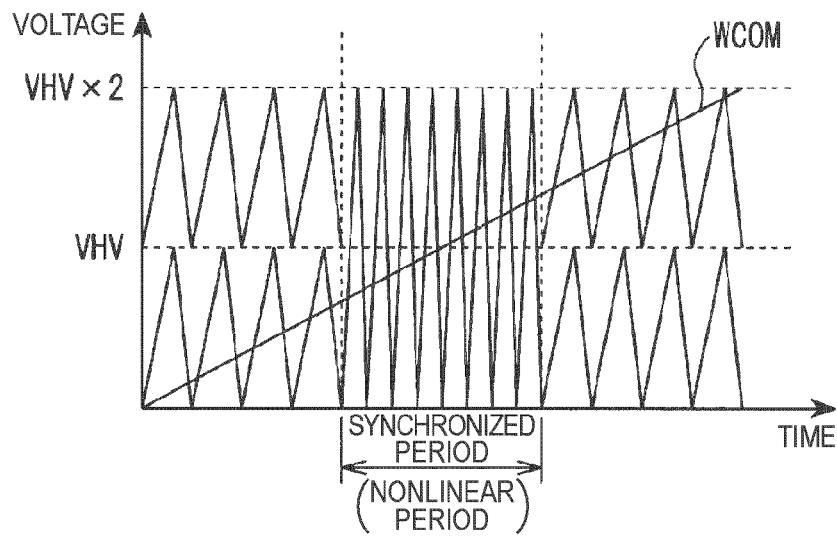
FIG. 21 is a diagram illustrating a triangular wave signal used in the modulator shown in FIG. 8.

FIG. 21 shows a state where the selection switch 36 is switched by the control section 35 and the operating frequency of the triangular wave signal generator 33 is controlled to input the triangular wave signal with a double wave height and a high frequency to both of the first comparator 34*a* and the second comparator 34*b* in the switching time of the first modulated signal PWM1 and the second modulated signal PWM2 and a predetermined period including the switching time, that is, when the drive waveform signal WCOM is in a predetermined area.

Figure 22:
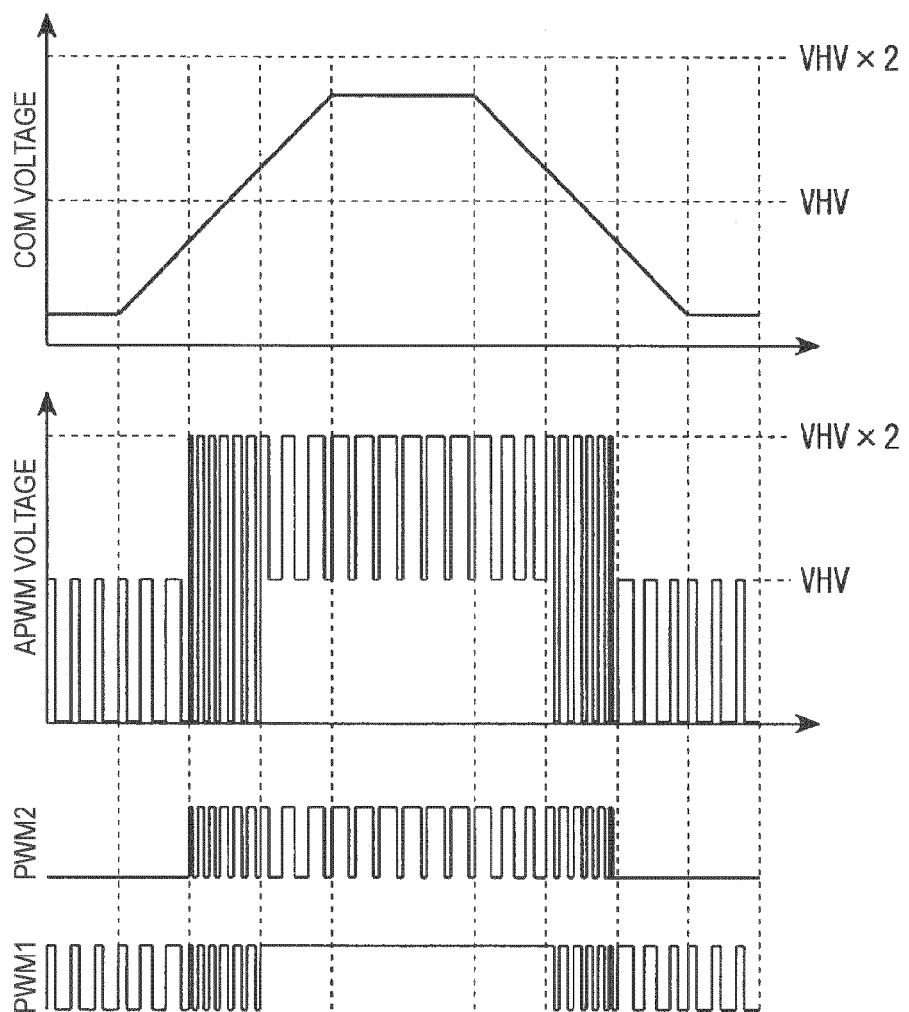
FIG. 22 is a diagram illustrating a drive signal based on the triangular wave signal shown in FIG. 19.

FIG. 22 shows the drive signal COM (drive pulses PCOM) when the first digital power amplifier 27*a* of the front stage and the second digital power amplifier 27*b* of the rear stage are synchronized and the modulation frequency is raised in the nonlinear periods of the first modulated signal PWM1 and the second modulated signal PWM2.

The modulation frequency component is satisfactorily reduced from the drive signal COM (drive pulses PCOM), thereby obtaining high waveform precision.

As described above, in the power amplifier according to this embodiment, the drive waveform signal WCOM serving as a reference for driving the actuators 22 is pulse-modulated into two (plural) modulated signals PWM1 and PWM2, the pulse-modulated two (plural) modulated signals PWM1 and PWM2 are amplified in power into the multi-value amplified digital signal APWM, and the amplified digital signal APWM is smoothed and output to the actuators 22. Accordingly, by combining the outputs of plural-stage digital power amplifiers 27*a* and 27*b* into the amplified digital signal APWM, the potential difference between the steps of the arrival potentials of the amplified digital signal APWM can be reduced and the order of the low pass filter 29 removing the frequency component of the modulated signal from the amplified digital signal APWM can be lowered. In addition, by using the multi-value signal as the amplified digital signal APWM, it is possible to obtain the drive signal COM (drive pulses PCOM) with high precision.

By lowering the order of the low pass filter 29, it is possible to simplify the circuit configuration and to reduce the circuit size.

Since the potential difference between the steps of the arrival potentials of the amplified digital signal APWM is small, the withstanding voltage of the switching elements Q1 and Q2 of the digital power amplifiers 27*a* and 27*b* can be lowered, thereby reducing the circuit size.

The source potential VHV can be lowered even with the same current consumption, thereby reducing the circuit size and saving the power.

Particularly, when the digital power amplifier 27*a* of the front stage is turned on and the digital power amplifier 27*b* of the rear stage is turned off, the power regeneration is caused, thereby further saving the power.

By allowing the control section 35 to switch one of the states where the same modulated signal is connected to two digital power amplifiers 27a and 27b and the state where different modulated signals are connected to different digital power amplifiers 27a and 27b, respectively, to the other, it is possible to enhance the precision of the drive signal COM (drive pulses PCOM).

By connecting the same modulated signal to the two digital power amplifiers 27a and 27b in the period when the input-output response characteristic of pulse modulation is nonlinear, it is possible to avoid the nonlinear part of the input-output response characteristic of pulse modulation and to enhance the precision of the drive signal COM (drive pulses PCOM).

By setting the pulse modulation frequency in a predetermined period to be higher than the pulse modulation frequency in a period other than the predetermined period, it is possible to satisfactorily reduce the modulation frequency component of pulse modulation by the use of the low pass filter 29.

In this embodiment, two stages of digital power amplifiers 27a and 27b are provided, but the number of digital power amplifier stages may be three or more. When a bootstrap circuit is provided in the digital power amplifier of the rear stage and the voltage is biased by the digital power amplifier of the front stage, it is possible to obtain a high output voltage with a small source potential.

The bootstrap circuit is not essential, and any circuit can be used as long as the power of plural modulated signals is amplified by plural digital power amplifiers.

A pulse density modulation (PDM) circuit may be used instead of the pulse width modulation circuit as the modulator. In this case, it is possible to obtain the drive signal COM (drive pulses PCOM) with higher precision.

In the above-mentioned embodiment, since a power source is shared by the plural-stages of digital power amplifiers by connecting the plural-stage digital power amplifiers to the same power source, the circuit size can be reduced. However, the plural-stage digital power amplifiers may be connected to power sources having different potentials. In this case, it is possible to enhance the number of multi values of the amplified digital signal, thereby obtaining the drive signal with higher precision.

In the above-mentioned embodiment, the power amplifier is used in the line-head liquid jet printing apparatus. However, the power amplifier according to the embodiment of the invention may be used in a multi-pass liquid jet printing apparatus.

In the above-mentioned embodiment, the power amplifier is applied to the liquid jet printing apparatus, but the invention is not limited to the embodiment. The power amplifier may be applied to a liquid ejecting apparatus jetting or ejecting liquids other than ink (including liquid materials in which functional material particles are dispersed and fluid materials such as gel) or fluids other than the liquids (such as solid materials which can be ejected as fluid).

Examples of the liquid ejecting apparatus include a liquid material ejecting apparatus ejecting liquid materials in which electrode materials or coloring materials used to manufacture a liquid crystal display, an EL (Electroluminescence) display, a surface emission display, a color filter, and the like are dispersed or dissolved, a liquid ejecting apparatus ejecting biological organics used to manufacture a biological chip, and a liquid ejecting apparatus ejecting a liquid as a sample and being used as a precise pipette.

The examples of the liquid ejecting apparatus may include a liquid ejecting apparatus ejecting lubricant to a precise machine such as a watch or a camera by the use of a pin point, a liquid ejecting apparatus ejecting onto a substrate a transparent resin liquid such as UV-curable resin to form micro semi-spherical lenses (optical lenses) used in optical communication devices, a liquid ejecting apparatus ejecting etchant such as acid or alkali to etch a substrate or the like, a fluid material ejecting apparatus ejecting gel, and a fluid-ejecting recording apparatus ejecting solid powder materials such as toner.

The invention can be applied to any of the above-mentioned ejecting apparatuses.

What is claimed is:

1. A power amplifier comprising:
a modulator that pulse-modulates a drive waveform signal serving as a reference of a drive signal applied to an actuator to output at least two post-modulated signals;
a digital power amplifier that amplifies the at least two post-modulated signals to output multi-value amplified digital signals, the digital power amplifier having a plurality of digital power amplifier stages each including a pair of push-pull switching elements; and
a low pass filter that filters the amplified digital signals and outputs the drive signal,
wherein the modulator includes a control section switching between three states of modulations according to time, including:
a first state where the modulator outputs a first post-modulated signal of the at least two post-modulated signals to the digital power amplifier, and the modulator outputs a second post-modulated signal, low to the digital power amplifier,
a second state where the modulator outputs the second post-modulated signal of the at least two post-modulated signals, high to the digital power amplifier, and
a third state where the modulator outputs the same post-modulated signal from the first post-modulated signal and the post-second modulated signal to the digital power amplifier.

2. The power amplifier according to claim 1, wherein the control section connects one of the modulated signals to two or more of the digital power amplifier stages in a nonlinear period, that is when an input-output response characteristic of pulse modulation is nonlinear.

3. The power amplifier according to claim 2, wherein the modulator sets a pulse modulation frequency higher in the nonlinear period than a set frequency out of the nonlinear period.

4. A liquid jet printing apparatus employing the power amplifier according to claim 1.

* * * * *